(12) United States Patent
McGregor

(10) Patent No.: US 7,436,678 B2
(45) Date of Patent: Oct. 14, 2008

(54) CAPACITIVE/RESISTIVE DEVICES AND PRINTED WIRING BOARDS INCORPORATING SUCH DEVICES AND METHODS OF MAKING THEREOF

(75) Inventor: David Ross McGregor, Apex, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 92 days.

(21) Appl. No.: 10/967,569

(22) Filed: Oct. 18, 2004

(65) Prior Publication Data

US 2006/0082981 A1 Apr. 20, 2006

(51) Int. Cl.
*H05K 7/00* (2006.01)

(52) U.S. Cl. .................. 361/760; 361/761; 361/763; 361/736; 361/793; 361/766; 361/811

(58) Field of Classification Search .............. 361/760, 361/761, 763, 738, 793, 766, 811
See application file for complete search history.

(56) References Cited

U.S. PATENT DOCUMENTS

| | | | |
|---|---|---|---|
| 3,934,119 A | 1/1976 | Trenkler | |
| 4,377,652 A | 3/1983 | Ohmura et al. | |
| 4,399,417 A * | 8/1983 | Ballantyne et al. | 330/109 |
| 4,407,883 A | 10/1983 | Newton | |
| 4,410,867 A * | 10/1983 | Arcidiacono et al. | 333/172 |
| 4,496,435 A | 1/1985 | Harada et al. | |
| 4,508,766 A | 4/1985 | Inaike et al. | |
| 4,752,555 A * | 6/1988 | Takada et al. | 430/314 |
| 5,093,036 A | 3/1992 | Shafe et al. | |
| 5,172,304 A | 12/1992 | Ozawa et al. | |
| 5,284,899 A | 2/1994 | Morishige et al. | |
| 5,470,643 A | 11/1995 | Dorfman | |
| 5,699,224 A * | 12/1997 | Hanamura et al. | 361/313 |
| 5,731,747 A | 3/1998 | Van De Walle et al. | |
| 5,757,076 A * | 5/1998 | Kambara | 257/724 |
| 5,928,766 A * | 7/1999 | Hanamura | 428/209 |
| 6,030,553 A | 2/2000 | Huang et al. | |
| 6,111,005 A | 8/2000 | Dietz et al. | |
| 6,140,402 A | 10/2000 | Dietz et al. | |
| 6,197,222 B1 | 3/2001 | Saraf et al. | |
| 6,278,356 B1 * | 8/2001 | Lin et al. | 338/309 |
| 6,535,398 B1 * | 3/2003 | Moresco | 361/792 |
| 6,541,137 B1 | 4/2003 | Kingon et al. | |
| 2004/0128822 A1 | 7/2004 | Tung | |
| 2004/0144476 A1 | 7/2004 | Fukuta et al. | |
| 2005/0224909 A1 * | 10/2005 | Yamaguchi et al. | 257/528 |

FOREIGN PATENT DOCUMENTS

| | | |
|---|---|---|
| EP | 0918339 A2 | 5/1999 |
| JP | 7-226302 | 8/1995 |

* cited by examiner

*Primary Examiner*—Jeremy C. Norris
*Assistant Examiner*—Hoa C Nguyen

(57) ABSTRACT

A capacitive/resistive device provides both resistive and capacitive functions. The capacitive/resistive device may be embedded within a layer of a printed wiring board. Embedding the capacitive/resistive device conserves board surface real estate, and reduces the number of solder connections, thereby increasing reliability.

6 Claims, 4 Drawing Sheets

CAPACITIVE/RESISTIVE DEVICES AND PRINTED WIRING BOARDS INCORPORATING SUCH DEVICES AND METHODS OF MAKING THEREOF

DESCRIPTION

The technical field relates to devices having both capacitive and resistive functions, and methods of incorporating such devices in organic dielectric laminates and printed wiring boards.

RELATED ART

Capacitors and resistors may be used in series for transmission line termination of signal traces extending between integrated circuit (IC) devices. The capacitors and resistors are used to match the impedance of an IC device to a line, or to reduce or eliminate signal reflection. Some circuits are continuous load and use a resistor in parallel with the line. Non-continuous load circuits have a resistor and capacitor in series and are useful for low power ICs. FIG. 1 schematically illustrates a non-continuous load termination of IC devices 10 and 20 from the prior art.

In FIG. 1, showing a conventional embodiment, the distance from a to b is typically short. The value of the resistor R is chosen to match the line impedance and is typically about 45-80 ohms. The value of the capacitor C is chosen so that the RC time constant of the resistor R and the capacitor C in series is greater than the rise time of a signal and less than the total time of the signal pulse. Typical capacitance values are on the order of 30 picoFarads.

Conventional RC terminations are typically constructed of a surface mount technology (SMT) resistor and capacitor. FIG. 2 is a cross section view of a portion of a conventional printed circuit board 25 having a SMT resistor 40 and a SMT capacitor 50 connected to an IC device 30 to form a conventional SMT RC transmission line termination for the IC 30. The signal line carrying the signal to the IC 30 is connected to a circuit trace 60 connecting the IC device 30 to the resistor 40. The capacitor 50 is coupled to a circuit trace 70 by one of a pair of solder pads 52 and solder joints 58. The resistor 40 is coupled to the circuit trace 70 by a solder pad 42 and a solder joint 48. The capacitor 50 is coupled to a via hole 80 by the other solder pad 58 and a circuit trace 59. This arrangement places the resistor 40 and the capacitor 50 in series with the signal line and connected to ground through a plated through-hole via 80. This conventional surface mount approach requires use of valuable surface real estate. Further, the requirement for solder joints reduces reliability and increases costs of fabrication.

SUMMARY

According to a first embodiment, a capacitive/resistive device comprises a first electrode, a dielectric disposed over the first electrode, a resistor element formed on and adjacent to the dielectric, a conductive trace, and a second electrode disposed over the dielectric and in electrical contact with the resistor element. The capacitive/resistive device can be embedded in organic dielectric laminates, and incorporated in printed wiring boards.

According to the above embodiment, both the resistor and the capacitor functions may be integrated into a single buried laminate, reducing the cost and difficulty in creating the resistor and capacitor functions. When the capacitive/resistive device is incorporated in a printed wiring board, embedding the capacitive/resistive device also frees up valuable real estate. Further, solder joints associated with SMT devices may be eliminated, thereby improving reliability. The capacitive/resistive device can be processed using conventional etching processes, further reducing production costs.

Those skilled in the art will appreciate the above stated advantages and other advantages and benefits of various additional embodiments of the invention upon reading the following detailed description of the embodiments.

BRIEF DESCRIPTION OF THE DRAWINGS

The detailed description will refer to the following drawings, wherein like numerals refer to like elements, and wherein.

Embodiments of the present invention are addressed to capacitive/resistive devices that may be buried in the substrate of a printed wiring board (PWB). Providing the capacitive and resistive functions within the PWB substrate conserves valuable surface real estate on the printed wiring board. The embodiments of the present invention also require fewer solder joints than conventional SMT termination arrangements.

Figure 1:
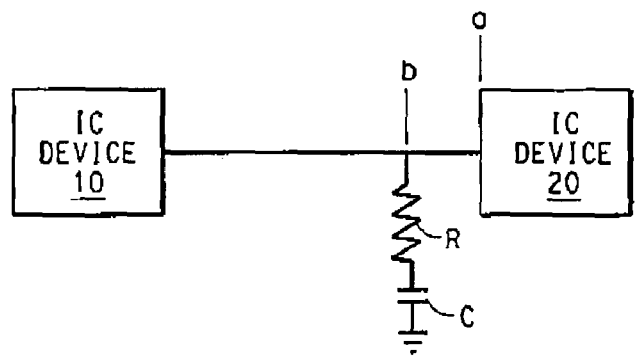
FIG. 1 is a schematic illustration of a conventional (prior art) non-continuous load termination having a resistor and capacitor in series.
Figure 2:
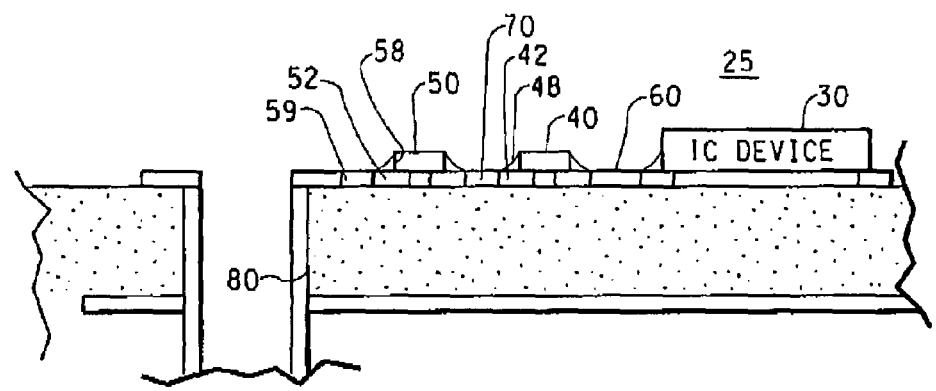
FIG. 2 is a cross section view of a printed wiring board having a conventional (prior art) SMT RC transmission line termination for an integrated circuit device.
Figure 3:
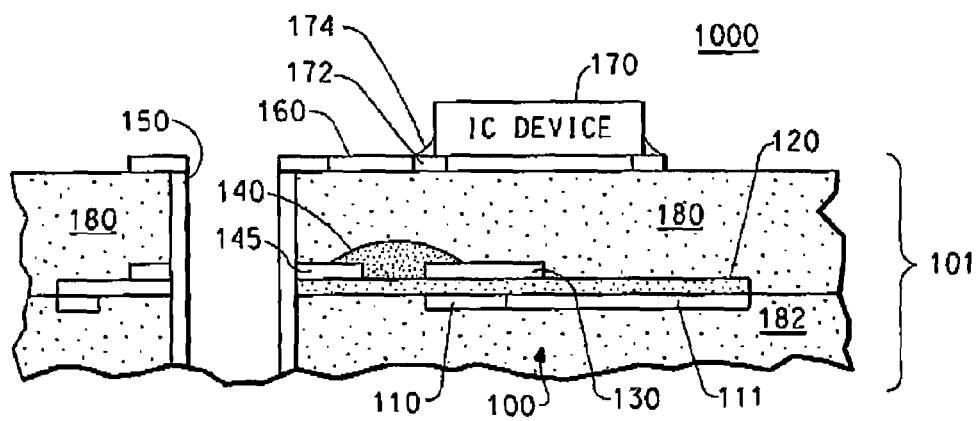
FIG. 3 is a section view of a portion of a printed wiring board having an embedded capacitive/resistive device according to a first embodiment.

FIG. 3 is a section view of a first embodiment of a portion of a printed wiring board 1000. The printed wiring board section 1000 includes an RC transmission line termination in which the resistor function and the capacitor function are integrated into a single capacitive/resistive device 100. The device 100 is embedded within the printed wiring board section 1000. The device 100 comprises a bottom electrode 110, a dielectric 120, a top electrode or top plate 130, a resistor element 140, and a conductive trace 145. The device 100 provides a resistive and a capacitive function in a single laminate structure generally indicated by the bracket 101.

The device 100 is coupled to an IC device 170 by a plated through hole via 150 extending through dielectric layers 180, 182, and a conductive circuit trace 160. The IC device 170 is connected to the conductive circuit trace 160 by a solder pad 172 and a solder joint 174. Other connection technology, however, may be used. The bottom electrode 110 can also serve as a conductive ground plane in the printed wiring board, and can be coupled to a conductive circuit trace 111 that connects to other circuitry.

FIGS. 4A-4F illustrate a method of making a capacitor laminate including the device 100.

Figure 4A:
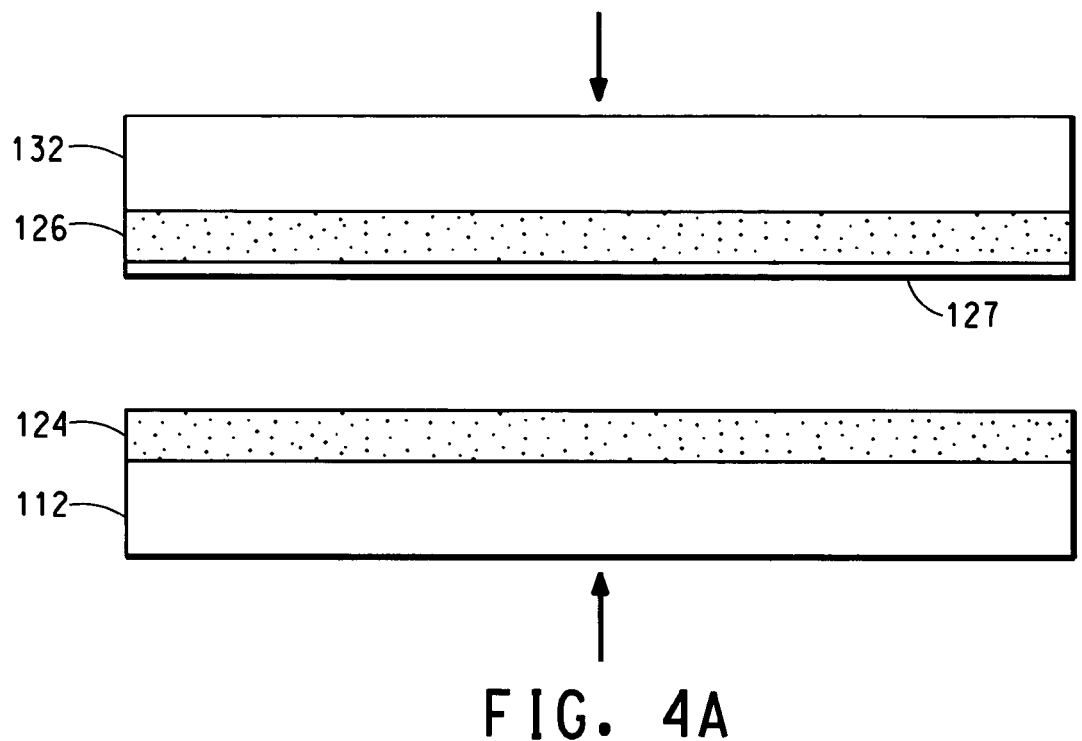
FIGS. 4A-4F illustrate a method of making the capacitive/resistive device illustrated in FIG. 3.

FIG. 4A is a section view in front elevation of the first stage of manufacture in which first and second metal foils 112, 132 are provided. The foils 112, 132 may be made from, for example, copper, copper-based materials, and other metals. A slurry material or a solution may be cast or coated onto the first foil 112, dried and cured, forming a first dielectric layer 124. Curing may be performed by drying, for example, at 150° C., if the slurry is of a thermoplastic nature. Higher curing temperatures can be used if the slurry is a thermoset material. A similar second dielectric layer 126 is formed in a similar manner on the second foil 132.

Solutions used to form the dielectric layers 124, 126 may comprise, for example, a polymer dissolved in a solvent. Slurry materials may comprise, for example, a polymer-solvent solution with a high dielectric constant ("high K") filler or functional phase. Suitable polymers for slurry or solution may include, for example, epoxies or polyimide resins. High K functional phases may be defined as materials with dielectric constants of greater than 500 and may include perovskites of the general formula $ABO_3$. Suitable fillers include, for example, crystalline barium titanate (BT), barium strontium titanate (BST), lead zirconate titanate (PZT), lead lanthanum titanate, lead lanthanum zirconate titanate (PLZT), lead magnesium niobate (PMN), and calcium copper titanate. Fillers may be in powder form.

A thin adhesive layer 127 may be applied to the surface of either one or both of the dielectric layers 124, 126 (shown in FIG. 4A on the dielectric layer 126). The adhesive layer 127 may be formed from a thermoplastic polymer and may be filled with a high dielectric phase to avoid dilution of the dielectric constant. The two structures are then laminated together under heat and pressure in the direction shown by the arrows in FIG. 4A.

Figure 4B:
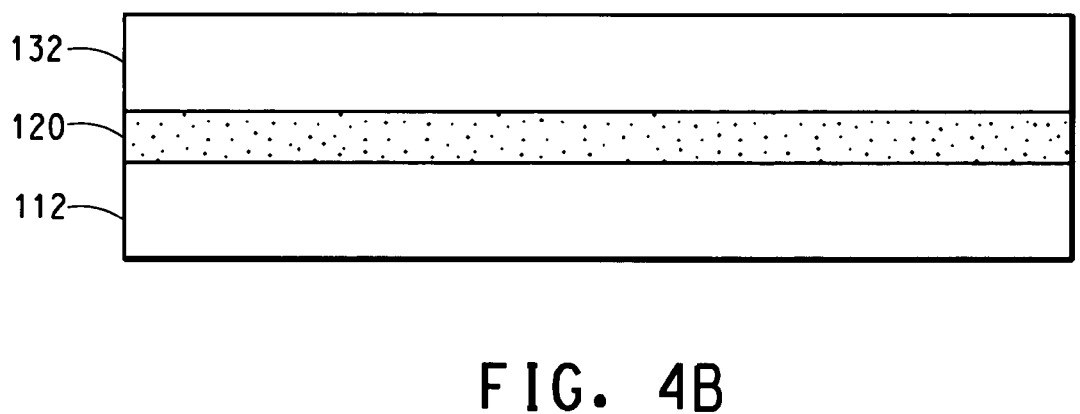

Referring to FIG. 4B, lamination forms a single dielectric 120 from the layers 124, 126 and 127. The adhesive layer 127 facilitates joining of the dielectric layers 124 and 126 during the lamination process. The adhesive layer 127, however, may be dispensed with if the dielectric layers 124 and 126 are only partially cured prior to lamination, or, are of a thermoplastic nature so that upon lamination a suitable temperature and pressure sufficiently softens the resin so that the layers 124 and 126 bond without adhesive. The resulting dielectric 120 can be, for example, a thin layer, on the order of 4-25 microns after lamination.

An alternative method of forming the dielectric 120 may be to cast a filled or unfilled thermoplastic polymer onto one of the foils 112, 132 and to directly laminate the other foil to the filled thermoplastic polymer. This method obviates the need for an adhesive layer. Yet another alternative method of manufacture includes forming the dielectric layer 120 separately as a single film and laminating it to the first foil 112 and the second foil 132 using heat and pressure.

Unfilled polymers such as, for example, polyimide dielectric INTERRA™ HK 04 (available from DuPont Electronic Technologies, Wilmington, Del.), can be used to form the dielectric 120.

Figure 4C:
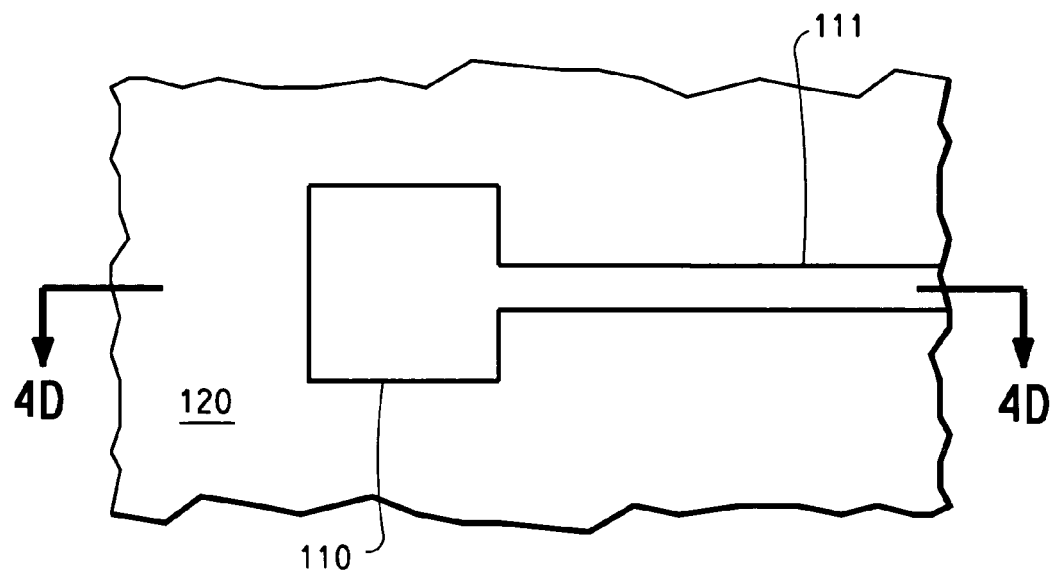

After lamination, a photoresist (not shown in FIG. 4B) is applied to the foil 112 and the foil 112 is imaged and etched, and the remaining photoresist is stripped using standard printing wiring board processing conditions. FIG. 4C is bottom section view of the resulting article after etching, taken on line 4C-4C in FIG. 4D. Referring to FIG. 4C, the etching produces the bottom electrode 110 of the device 100. The conductive circuit trace 111 can also be formed from the foil 112 to connect the bottom electrode 110 to ground or other circuitry.

Figure 4D:
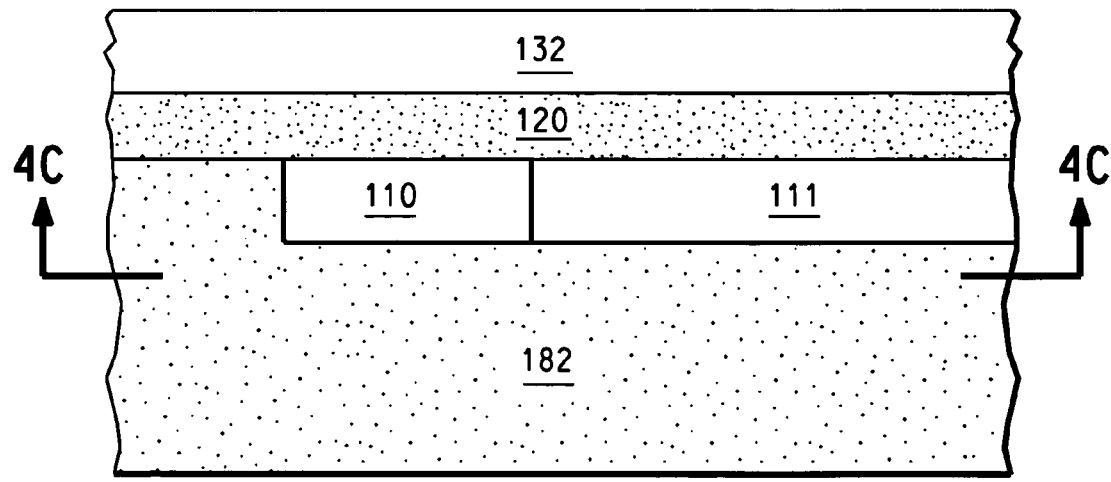

FIG. 4D is a section view in front elevation taken on line 4D-4D in FIG. 4C. Referring to FIG. 4D, the bottom electrode 110 side of the resulting article is laminated to a dielectric laminate material 182. The lamination can be performed, for example, using FR4 prepreg, or other prepregs, in standard printing wiring board processes.

Figure 4E:
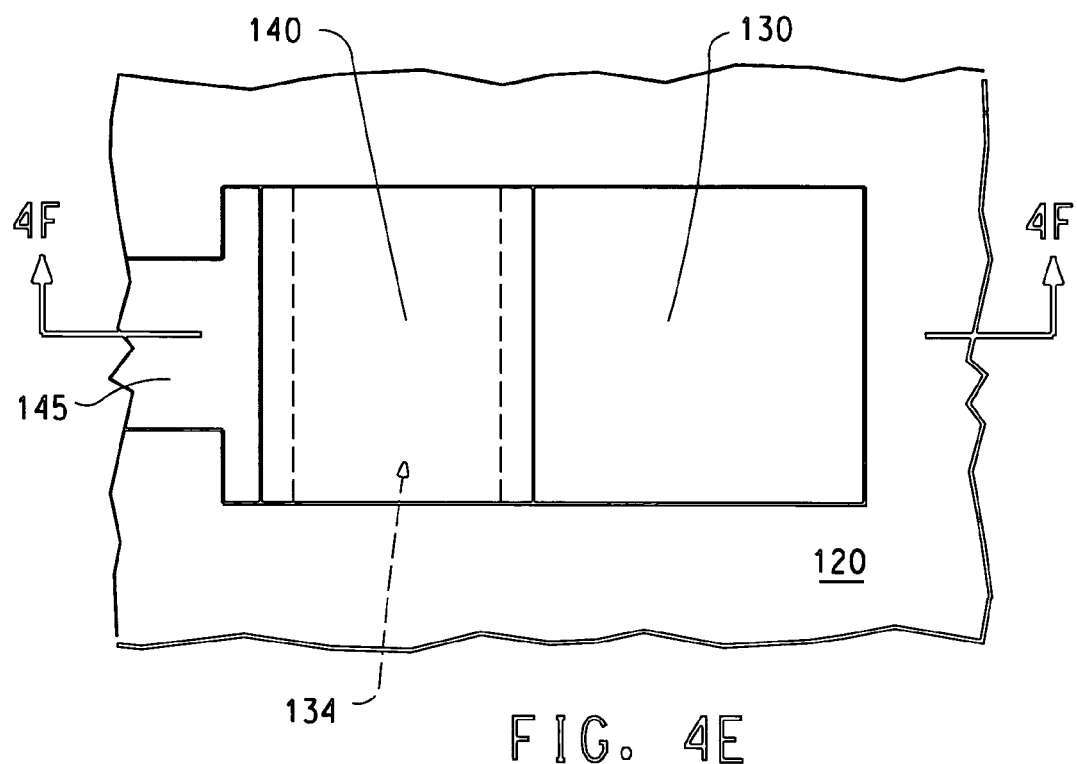
Figure 4F:
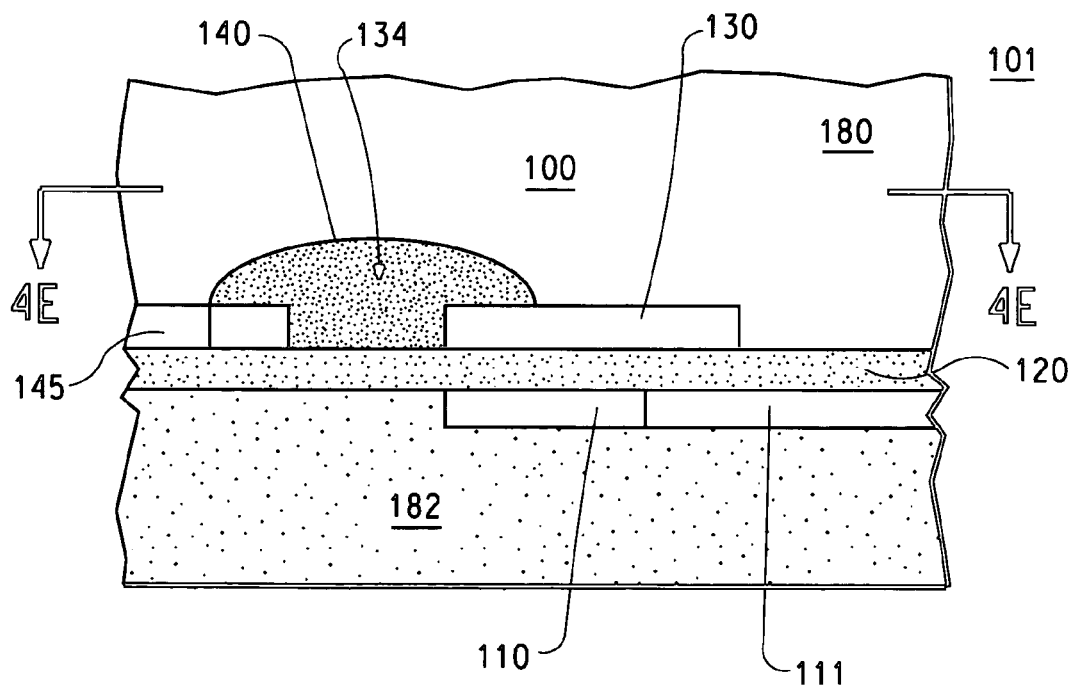

A photoresist (not shown in FIG. 4D) is applied to the foil 132 and the foil 132 is imaged and etched, and the remaining photoresist is stripped. FIG. 4E is top section view of the resulting article after etching, taken on line 4E-4E in FIG. 4F. FIG. 4F is a section view in front elevation of the resulting article taken on line 4F-4F in FIG. 4E. Referring to FIG. 4E, the etching produces the top electrode 130 of the device 100, a gap 134, and the conductive circuit trace 145.

Referring to FIG. 4F, a resistor element 140 is formed by depositing a resistor material over the dielectric 120 and into the gap 134. The resistor element 140 can be formed, for example, by depositing a polymer thick-film resistor paste, and curing the resistor paste. The top electrode 130 and the conductive circuit trace 145 serve as terminations for the resistor element 140. The polymer thick-film resistor paste can be made from materials such as, for example, carbon powders dispersed in a screen-printing vehicle. The screen-printing vehicle may comprise, for example, an epoxy resin dissolved in a suitable solvent. Other additives, such as surfactants, may be added to modify dielectric properties of the resultant resistor element 140.

After curing the resistor element 140, a dielectric layer 180 is laminated to the component side of the dielectric layer 182, forming a laminate structure 101. The laminate structure 101 resulting from the above process can then be incorporated into, for example, a printed wiring board as shown in FIG. 3 using conventional lamination and via formation processes.

EXAMPLE 1

This example of the device 100 is discussed with reference to FIG. 3. In this example, the electrodes 110, 130 are formed from copper foils and the dielectric 120 is an unfilled polyimide dielectric of 25 microns thickness having a dielectric constant (Dk) of 3.5 thereby yielding a capacitance density of 800 picoFarads per square inch (INTERRA™ HK 04, available from DuPont Electronic Technologies, Wilmington, Del.).

The size (when viewed from a top plan perspective) of the capacitor needed for a transmission line termination of 30 picoFarad is 24.2 square mm, which corresponds to slightly less than 5 mm by 5 mm. The deposited resistor material is a screen-printable 100 ohm per square polymer thick-film resistor paste (available from DuPont Electronics).

The size of the resistor in this example for a nominal 60 ohm resistance can be varied, preferably maintaining a length to width ratio in the range of about 0.6 to 1.0. The above capacitor size is acceptable if relatively few termination resistors are needed for the IC. In cases where large numbers of terminations are required, a laminate with a higher capacitance density is more desirable as the capacitor can be made smaller.

EXAMPLE 2

This example of the device 100 is discussed with reference to FIG. 3. In this example, a laminate is formed by casting a barium titanate-filled thermoplastic polyimide on one copper foil and laminating a second copper foil onto the surface of the barium titanate-filled thermoplastic polyimide coating. Barium titanate is advantageous as a filler as it is readily available and lead-free.

Lamination is performed at a suitable temperature and pressure so as to bond the articles together without use of a separate adhesive material. The electrodes 110, 130 are formed from copper foils and the dielectric 120 is a filled polyimide dielectric of 14 micron thickness having a dielectric constant (Dk) of 11 thereby yielding a capacitance density of 4.5 nanoFarads per square inch (Interra™ HK 11 available from DuPont Electronic Technologies).

The size of the capacitor needed for a transmission line termination as described above is 4.3 square mm, or approximately 2 mm by 2 mm. The deposited resistor is a screen printed 100 ohm per square inch polymer thick-film resistor paste (available from DuPont Electronics).

A preferred size of the resistor in this example for a nominal 60 ohm resistance is 1.2 mm long and 2 mm wide, having a length to width aspect ratio 0.6 to 1.0.

EXAMPLE 3

This example of the device 100 is discussed with reference to FIG. 3. In this example, the laminate is made by casting a barium titanate-filled thermoplastic polyimide (available from DuPont Electronic Technologies) on two copper foils and laminating them together at a suitable temperature and pressure to bond them together. A separate adhesive material is not used. The electrodes 110, 130 are formed from the copper foils. The resulting dielectric 120 is a barium titanate-filled, polyimide dielectric of 8 microns thickness having a capacitance density of 6.2 nanoFarads per square inch.

The size of the capacitor needed for a transmission line termination as described above is 3.1 square mm, or approximately 1.77 mm by 1.77 mm. The deposited resistor can be formed from a screen printed 100 ohm per square polymer thick-film resistor paste (available from DuPont Electronics).

A preferred size of the resistor for a nominal 60 ohm resistance in this example would be 1.06 mm long and 1.77 mm wide, having a length to width aspect ratio 0.6 to 1.0.

According to the above embodiments, thin capacitor laminate structures in combination with resistors may be used to reduce the size of the buried capacitor function, and to more effectively bury RC transmission line terminations. Embedding the capacitor and resistor functions frees up valuable board surface real estate and eliminates solder joints associated with SMT devices, thereby improving reliability. Further, the laminates combining resistance and capacitance within the laminate can be processed using conventional etching processes, which reduces production costs.

The above embodiments also provide other options for circuit designers and PWB fabricators. For example, one piece of laminate can be used to embed discrete resistors and discrete capacitors, which reduces the inductance associated with connecting resistors and capacitors.

According to the above embodiments, thin capacitor laminate structures in combination with resistors may be used to reduce the size of the buried capacitor function, and to more effectively bury RC transmission line terminations. Embedding the capacitor and resistor functions frees up valuable board surface real estate and eliminates solder joints associated with SMT devices, thereby improving reliability. Further, the laminates combining resistance and capacitance within the laminate can be processed using conventional etching processes, which reduces production costs.

The above embodiments also provides other options for circuit designers and PWB fabricators. For example, one piece of laminate can be used to embed many discrete resistors and many discrete capacitors, which reduces the inductance associated with connecting resistors and capacitors.

The shapes of the capacitor embodiments in top plan view are generally rectangular. However, the capacitor electrodes, dielectrics, and other components and layers can have other regular or irregular surface area shapes, such as, for example, round, oblong, oval or polygonal shapes.

A single capacitive/resistive device 100 is formed in the laminate structures 101 described above. However, panel structures and printed wiring boards can include a large number of individual capacitive/resistive devices of differing type and arrangement.

In the above embodiment, resistance, capacitance and inductance combine to create a specific circuit impedance, typically identified by the capital letter Z. The resistance and capacitance may be structured to achieve a specific impedance. Changing the resistance, capacitance, or both will change the inductance. All three changes can be controlled to define the final impedance. In other words, the impedance of the laminate is 'tunable.'

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

The invention claimed is:

1. A capacitive/resistive device, comprising:
   a first metallic foil electrode;
   a dielectric disposed on the first metallic foil electrode, said dielectric having a thickness of 4 to 25 microns;
   a resistor element formed on and adjacent to the dielectric;
   a conductive trace; and
   a second metallic foil electrode disposed on the dielectric and in electrical contact with the resistor element, wherein the dielectric is disposed between the first metallic foil electrode and the second metallic foil electrode, and wherein the resistor element extends between and covers a portion of the second metallic foil electrode and said conductive trace.

2. The capacitive/resistive device of claim 1, wherein the resistor element extends across a gap between the second metallic foil electrode and the conductive trace and abuts the dielectric.

3. The capacitive/resistive device of claim 1, wherein the dielectric comprises an unfilled polymer.

4. The capacitive/resistive device of claim 1, wherein the dielectric comprises a polymer filled with a dielectric functional phase.

5. A capacitive/resistive device, comprising:
   a first metallic foil electrode;
   a dielectric disposed on the first metallic foil electrode;
   a resistor element formed on and adjacent to the dielectric;
   a conductive trace; and
   a second metallic foil electrode disposed on the dielectric and in electrical contact with the resistor element, wherein the dielectric is disposed between the first metallic foil electrode and the second metallic foil electrode, and wherein the resistor element extends between and covers a portion of the second metallic foil electrode and said conductive trace; and
   wherein such device is embedded within at least two organic dielectric laminate layers, wherein the laminate layers and the capacitive/resistive device form a laminate structure.

6. A printed wiring board, comprising:
   at least one laminate structure according to claim 5; and
   at least one IC device disposed on a top surface of the printed wiring board, wherein the IC device is electrically coupled to the capacitive/resistive device.

* * * * *